(12) United States Patent
Lee et al.

(10) Patent No.: US 12,229,361 B2
(45) Date of Patent: Feb. 18, 2025

(54) TRANSPARENT TOUCH DISPLAY APPARATUS

(71) Applicant: LG Display Co., Ltd., Seoul (KR)

(72) Inventors: Hwi Deuk Lee, Gumi-si (KR); Yang Sik Lee, Seoul (KR); Yong Chan Park, Seoul (KR); Hyoung Su Kim, Seoul (KR); Sung Su Han, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/451,454

(22) Filed: Aug. 17, 2023

(65) Prior Publication Data

US 2023/0393681 A1 Dec. 7, 2023

Related U.S. Application Data

(63) Continuation of application No. 17/354,618, filed on Jun. 22, 2021, now Pat. No. 11,768,550.

(30) Foreign Application Priority Data

Dec. 31, 2020 (KR) .................. 10-2020-0189743

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0446* (2019.05); *H10K 50/865* (2023.02);
(Continued)

(58) Field of Classification Search
CPC ........ G06F 3/0446; G06F 3/041; G06F 3/044; G06F 3/0412; G06F 3/04164;
(Continued)

(56) References Cited

U.S. PATENT DOCUMENTS 9,619,066 B2 4/2017 Gwon et al.
9,760,230 B2 9/2017 Ono et al.
(Continued)

FOREIGN PATENT DOCUMENTS

CN 106354302 A 1/2017
CN 110045875 A 7/2019
(Continued)

OTHER PUBLICATIONS

Extended European search report, European Patent Application No. 21180604.7, Nov. 24, 2021, 11 pages.
(Continued)

*Primary Examiner* — Olga V Merkoulova
(74) *Attorney, Agent, or Firm* — Fenwick & West LLP

(57) ABSTRACT

A transparent touch display apparatus including a device substrate, a touch electrode and a routing line. The device substrate may include an emission area and a transmission area. The touch electrode may be disposed on the transmission area of the device substrate. The routing line may be disposed outside the emission area and the transmission area of the device substrate. A transmittance of the touch electrode may be higher than a transmittance of the routing line. Thus, in the transparent touch display apparatus, the reliability of the touch detection may be improved.

18 Claims, 5 Drawing Sheets

(51) Int. Cl.
*H10K 50/86* (2023.01)
*H10K 59/38* (2023.01)
*H10K 59/40* (2023.01)
*H10K 50/844* (2023.01)
*H10K 59/12* (2023.01)

(52) U.S. Cl.
CPC ............. *H10K 59/38* (2023.02); *H10K 59/40* (2023.02); *G06F 2203/04112* (2013.01); *H10K 50/844* (2023.02); *H10K 59/12* (2023.02)

(58) Field of Classification Search
CPC ........... G06F 2203/04112; H01L 27/32; H01L 51/52; H10K 59/40; H10K 59/12; H10K 50/844
See application file for complete search history.

(56) References Cited

U.S. PATENT DOCUMENTS

| | | | |
|---|---|---|---|
| 10,452,177 B2 | 10/2019 | Nakanishi | |
| 10,754,459 B2 | 8/2020 | Yang et al. | |
| 10,795,483 B2 | 10/2020 | Hwang et al. | |
| 10,908,724 B2 | 2/2021 | Nakanishi | |
| 10,910,454 B2 | 2/2021 | Takechi et al. | |
| 11,177,462 B2 * | 11/2021 | Park | G09G 3/3208 |
| 11,188,162 B2 | 11/2021 | Gwon et al. | |
| 11,360,597 B2 | 6/2022 | Nakanishi | |
| 2010/0283762 A1 | 11/2010 | Takusa | |
| 2011/0279405 A1 | 11/2011 | Meng | |
| 2012/0319966 A1 | 12/2012 | Reynolds | |
| 2013/0103747 A1 * | 4/2013 | Mizuki | A63F 13/87 709/203 |
| 2013/0106747 A1 | 5/2013 | Choi et al. | |
| 2015/0011030 A1 | 1/2015 | Choi et al. | |
| 2015/0376466 A1 | 12/2015 | Mitamura et al. | |
| 2016/0041665 A1 * | 2/2016 | Gwon | G06F 3/0412 345/174 |
| 2016/0077629 A1 | 3/2016 | Ono et al. | |
| 2017/0010734 A1 | 1/2017 | Liu et al. | |
| 2017/0069692 A1 * | 3/2017 | Lee | H10K 50/86 |
| 2017/0213873 A1 * | 7/2017 | Bok | H10K 59/1213 |
| 2017/0371464 A1 | 12/2017 | Nakanishi | |
| 2018/0061898 A1 * | 3/2018 | Oh | H10K 59/122 |
| 2018/0095567 A1 | 4/2018 | Lee et al. | |
| 2018/0181240 A1 | 6/2018 | Heo et al. | |
| 2018/0182816 A1 | 6/2018 | Kang et al. | |
| 2018/0321530 A1 | 11/2018 | Tada et al. | |
| 2019/0204954 A1 | 7/2019 | Kim et al. | |
| 2019/0259818 A1 | 8/2019 | Jeon et al. | |
| 2019/0280053 A1 | 9/2019 | Oh et al. | |
| 2020/0004363 A1 | 1/2020 | Yang et al. | |
| 2020/0012374 A1 | 1/2020 | Nakanishi | |
| 2020/0013838 A1 | 1/2020 | Takechi et al. | |
| 2020/0026383 A1 | 1/2020 | Hwang et al. | |
| 2020/0083312 A1 * | 3/2020 | Kim | H10K 59/35 |
| 2020/0142525 A1 | 5/2020 | Han et al. | |
| 2020/0167038 A1 | 5/2020 | Lee et al. | |
| 2020/0212363 A1 * | 7/2020 | Park | G09G 3/3208 |
| 2020/0409485 A1 | 12/2020 | Gwon et al. | |
| 2021/0089156 A1 | 3/2021 | Nakanishi | |
| 2021/0191552 A1 | 6/2021 | Bok et al. | |
| 2021/0326022 A1 | 10/2021 | Lu | |

FOREIGN PATENT DOCUMENTS

| | | |
|---|---|---|
| CN | 110658952 A | 1/2020 |
| CN | 112148144 A | 12/2020 |
| EP | 3657310 A1 | 5/2020 |
| JP | 2011-100357 A | 5/2011 |
| JP | 2016-038594 A | 3/2016 |
| JP | 2016-062203 A | 4/2016 |
| JP | 6097663 B2 | 3/2017 |
| JP | 2018-004733 A | 1/2018 |
| JP | 2020-009634 A | 1/2020 |
| JP | 2020-013576 A | 1/2020 |
| KR | 10-2011-0100102 A | 9/2011 |
| KR | 10-2015-0002389 A | 1/2015 |
| KR | 10-2021-0152326 A | 12/2021 |
| TW | 201445380 A | 12/2014 |

OTHER PUBLICATIONS

First Office Action, Japanese Patent Application No. 2021-113215, May 24, 2022, 6 pages.
Indian Office Action, Industrial Property Office Patent Application No. 202114028908, Jul. 4, 2022, 7 pages.
Taiwanese Office Action and Search Report, Taiwan Intellectual Property Office Patent Application No. 110132826, Jun. 28, 2022, 7 pages.
U.S. Appl. No. 17/354,618, filed Jun. 3, 2022, 12 pages.
U.S. Appl. No. 17/354,618, filed Oct. 7, 2022, 12 pages.
U.S. Appl. No. 17/354,618, filed Jan. 13, 2023, 13 pages.
China National Intellectual Property Administration, Office Action, Chinese Patent Application No. 202110811709.X, Nov. 23, 2024, 17 pages.

* cited by examiner

TRANSPARENT TOUCH DISPLAY APPARATUS

CROSS-REFERENCE TO RELATED APPLICATION

This application is a continuation of U.S. patent application Ser. No. 17/354,618 filed on Jun. 22, 2021, which claims the priority benefit of Korean Patent Application No. 10-2020-0189743, filed on Dec. 31, 2020, which is hereby incorporated by reference as if fully set forth herein.

BACKGROUND OF THE INVENTION

Field of the Invention

The present disclosure relates to a transparent touch display apparatus in which a touch electrode and a routing line are disposed on a device substrate including an emission area and a transmission area.

Discussion of the Related Art

Generally, an electronic appliance, such as a monitor, a TV, a laptop computer and a digital camera, includes a display apparatus to realize an image. For example, the display apparatus may include a light-emitting device. The light-emitting device may emit light displaying a specific color. For example, the light-emitting device may include a light-emitting layer between two electrodes.

In the display apparatus, a device substrate may include an emission area in which the light-emitting device is disposed, and a transmission area disposed outside the emission area. For example, the display apparatus may be a transparent display apparatus that is recognized as transparent glass, when the image is not realized. The transparent display apparatus may detect a touch of user and/or tool. For example, the transparent display apparatus may include a touch electrode and a routing line, which are disposed on the device substrate. Generally, the touch electrode and the routing line may be disposed outside the emission area and the transmission area.

SUMMARY OF THE INVENTION

When the number of the touch electrode and the routing line disposed outside the emission area and the transmission area is increased for the precise detection of the touch, a transmittance of the transparent display apparatus may be lowered. Further, in the transparent display apparatus, the distortion of a touch signal due to the density of the routing lines may occur.

Accordingly, the present disclosure is directed to a transparent touch display apparatus that substantially obviates one or more problems due to limitations and disadvantages of the related art.

An object of the present disclosure is to provide a transparent touch display apparatus in which the decrease of the transmittance is minimized, and the touch of user and/or tool is precisely detected.

Another object of the present disclosure is to provide a transparent touch display apparatus capable of improving the reliability of the touch detection.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a transparent touch display apparatus comprising a device substrate. The device substrate includes an emission area and a transmission area. A light-emitting device and the encapsulating element are disposed on the device substrate. The light-emitting device is disposed on the emission area of the device substrate. The encapsulating element covers the light-emitting device. A routing line and a touch electrode are disposed on the encapsulating element. The routing line is disposed outside the emission area and the transmission area. The touch electrode is connected to the routing line. The touch electrode extends on the transmission area. The touch electrode has a transmittance higher than the routing line.

The touch electrode may be disposed on the encapsulating element.

A touch insulating layer may be between the touch electrode and the routing line. The touch electrode may be electrically connected to the routing line through a touch contact hole in the touch insulating layer A color filter and a black matrix may be disposed on the encapsulating element. The color filter may overlap the emission area. The black matrix may be disposed side by side with the color filter. The black matrix may cover the routing line. The black matrix may be disposed outside the emission area and the transmission area.

The touch electrode may include one of Indium Tin Oxide (ITO) and Indium Zinc Oxide (IZO).

A touch pad may be disposed on the device substrate. The touch pad may be spaced away from the encapsulating element. The touch pad may include the same material as the routing line.

The routing line may include a first conductive layer on the encapsulating element, and a second conductive layer on the first conductive layer. A transmittance of the first conductive layer may be higher than a transmittance of the second conductive layer.

A touch line may extend between the emission area and the transmission area. The touch line may be connected to the routing line, overlap with the routing line and extend in parallel with the routing line.

The second conductive layer may have an electric conductivity higher than the first conductive layer.

The touch electrode may include the same material as the first conductive layer.

The touch electrode may be disposed on the same layer as the routing line.

In another embodiment, the transparent touch display apparatus includes a device substrate. The device substrate includes an emission area and a transmission area. A light-emitting device is disposed on the emission area of the device substrate. Touch electrodes are disposed side by side on the transmission area of the device substrate. Routing lines respectively connected to the touch electrodes are disposed outside the emission area and the transmission area. Each of the touch electrodes is composed of a transparent conductive material. In addition, the routing lines have a resistance lower than the touch electrodes.

The routing lines may include a metal.

Each of the touch electrodes may include a touch pattern of mesh shape which extends in a first direction and a second direction different from the first direction. For example, the second direction may be perpendicular to the first direction.

Each of the touch electrodes may be connected to one of the routing lines at the outside of the emission area and the transmission area.

The routing lines may be covered by a touch insulating layer. The touch electrodes may be disposed on the touch insulating layer.

A cover substrate may be disposed on the light-emitting devices, the touch electrodes and the routing lines. A color filter, a black matrix and a cover planarization layer may be disposed on a lower surface of the cover substrate toward the device substrate. The color filter may overlap the emission area. The black matrix may be disposed side by side with the color filter. The black matrix may overlap the routing lines. The cover planarization layer may cover the color filter and the black matrix.

The light-emitting device may be covered by an upper passivation layer. A cover passivation layer may be disposed on the upper passivation layer. An adhesive layer may be disposed between the upper passivation layer and the cover passivation layer. The routing lines and the touch electrodes may be disposed between the cover passivation layer and the cover planarization layer.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
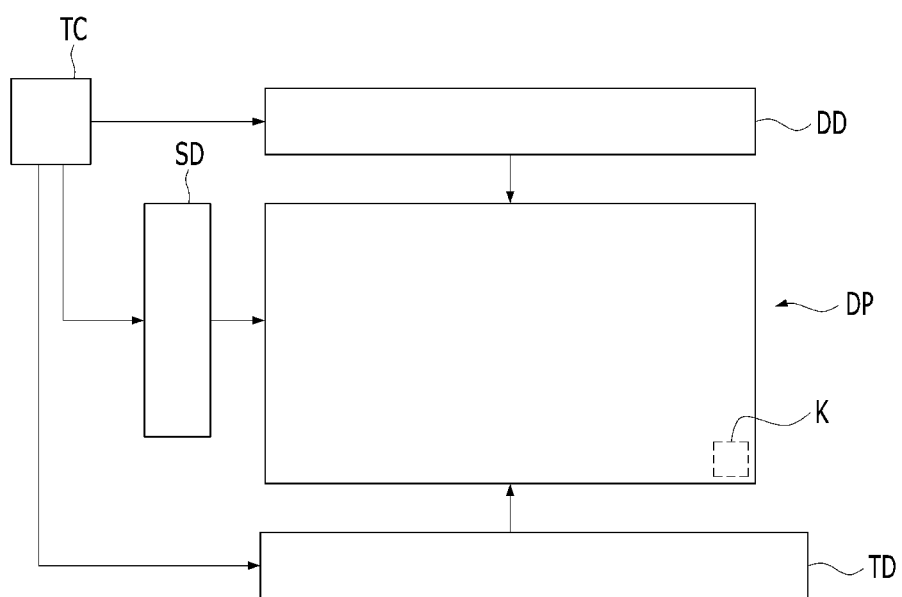
FIG. 1 is a view schematically showing a transparent touch display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
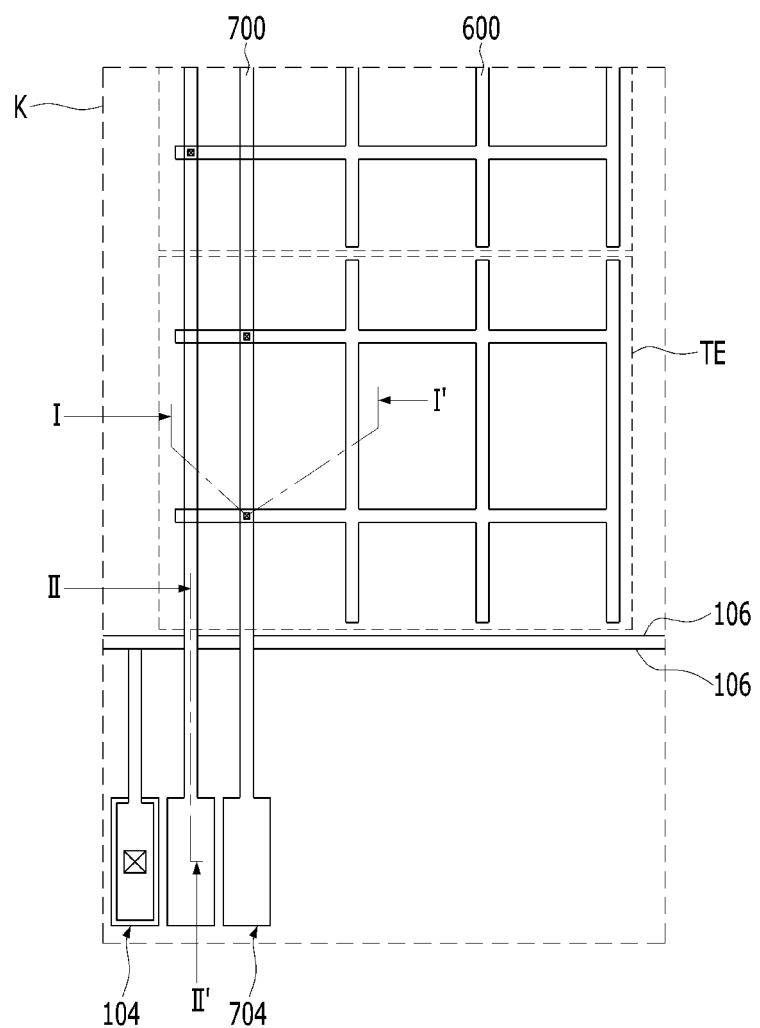
FIG. 2 is an enlarged view of K region in FIG. 1.
Figure 3:
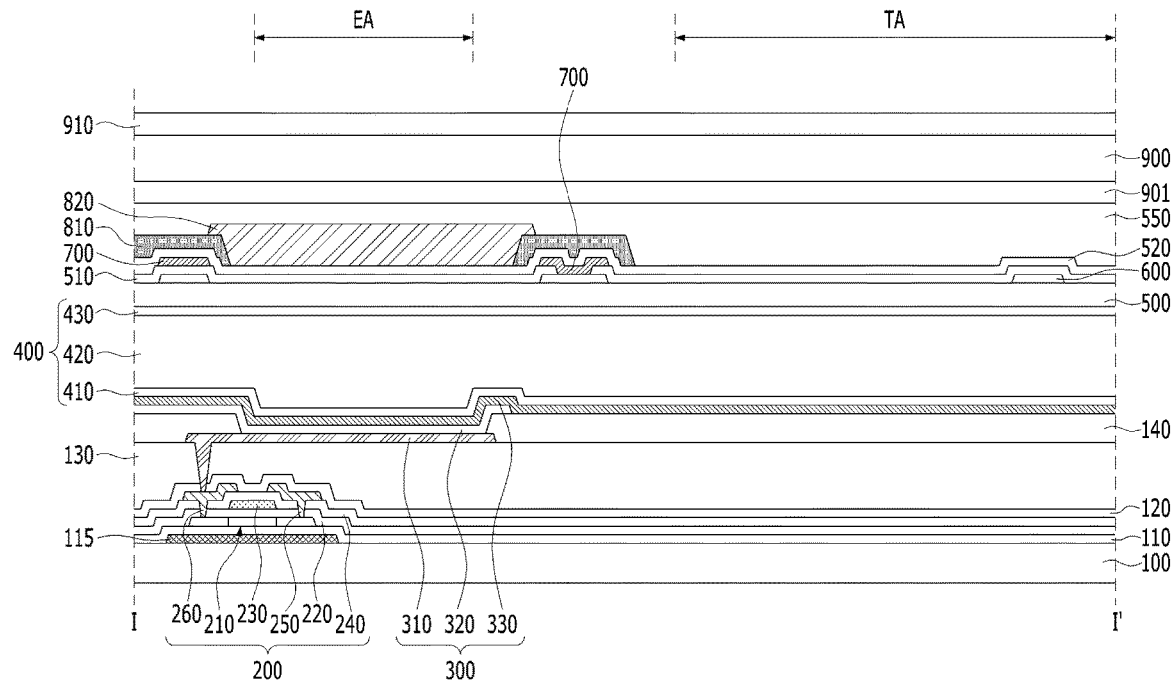
FIG. 3 is a cross-sectional view taken along I-I' of FIG. 2.
Figure 4:
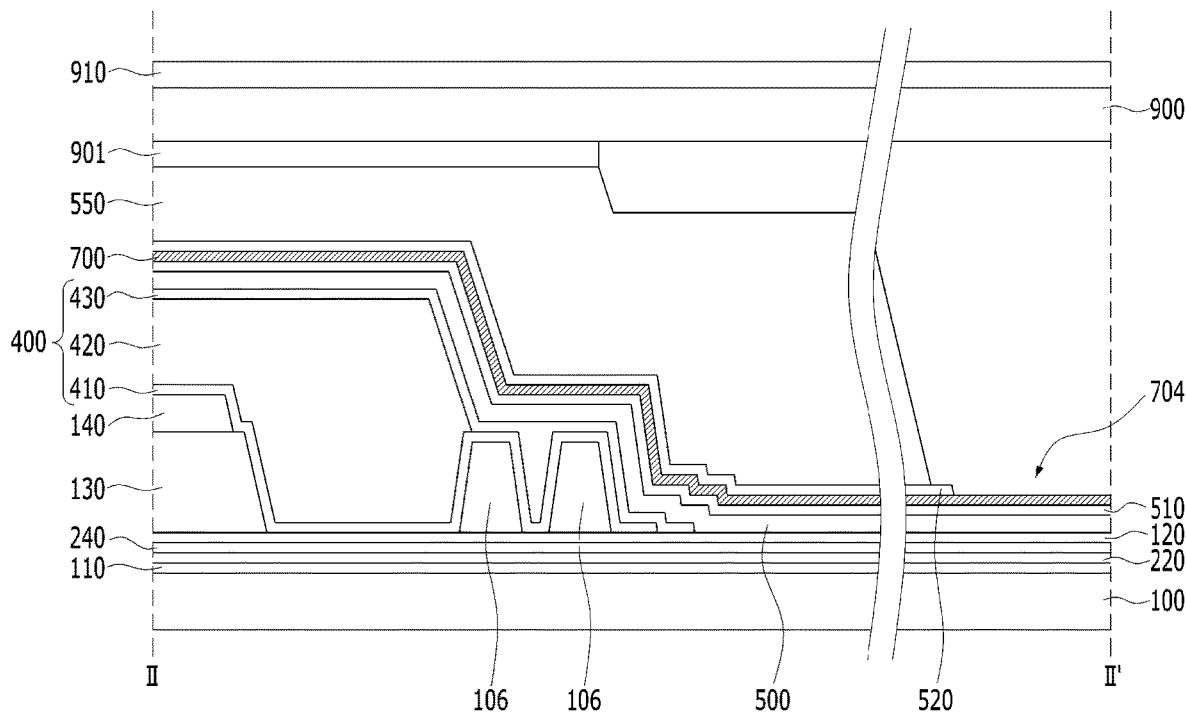
FIG. 4 is a cross-sectional view taken along II-II' of FIG. 2.

FIG. 1 is a view schematically showing a transparent touch display apparatus according to an embodiment of the present disclosure. FIG. 2 is an enlarged view of K region in FIG. 1. FIG. 3 is a cross-sectional view taken along I-I' of FIG. 2. FIG. 4 is a cross-sectional view taken along II-II' of FIG. 2.

Referring to FIGS. 1 to 4, the transparent touch display apparatus according to the embodiment of the present disclosure may include a display panel DP and driving parts DD, SD, TD and TC. The driving parts DD, SD, TD and TC may provide various signals to the display panel DP to display an image. For example, the driving parts DD, SD, TD and TC may include a data driver DD applying a data signal, a scan driver SD applying a scan signal and a timing controller TC. The timing controller TC may apply a video digital data and a source timing control signal to the data driver DD, and apply clock signals, reset clock signals and start signals to the scan driver SD.

The display panel DP may generate the image provided to user. For example, the display panel DP may include at least one light-emitting device 300 which is disposed on a device substrate 100. The device substrate 100 may include an insulating material. For example, the device substrate 100 may include glass or plastic. Hereinafter, the light-emitting device 300 may be described into an organic light-emitting device as an example of embodiments of the present disclosure, but the present disclosure is not limited thereto. For example, the light-emitting device 300 may be implemented as an inorganic light-emitting device such as micro-LED or QLED.

At least one driving circuit may be disposed on the device substrate 100. The driving circuit may be electrically connected to the light-emitting device 300. The driving circuit may be controlled by a signal applied to the driving part DD, SD, TD and TC. For example, the driving circuit may provide a driving current corresponding to the data signal to the light-emitting device according to the scan signal. The driving circuit may include at least one thin film transistor 200. For example, the thin film transistor 200 may include a semiconductor pattern 210, a gate insulating layer 220, a gate electrode 230, an interlayer insulating layer 240, a source electrode 250 and a drain electrode 260.

The semiconductor pattern 210 may include a semiconductor material. For example, the semiconductor pattern 210 may include amorphous silicon (a-Si) or poly-crystalline silicon (poly-Si). The semiconductor pattern 210 may be an oxide semiconductor. For example, the semiconductor pattern 210 may include a metal oxide, such as IGZO. The semiconductor pattern 210 may include a source region, a drain region and a channel region. The channel region may be disposed between the source region and the drain region. The source region and the drain region may have a resistance lower than the channel region.

The gate insulating layer 220 may be disposed on the semiconductor pattern 210. The gate insulating layer 220 may extend beyond the semiconductor pattern 210. For example, a side surface of the semiconductor pattern 210 may be covered by the gate insulating layer 220. The gate insulating layer 220 may include an insulating material. For example, the gate insulating layer 220 may include silicon oxide (SiO) and/or silicon nitride (SiN). The gate insulating layer 220 may include a material having high dielectric constant. For example, the gate insulating layer 220 may include a High-K material, such as hafnium oxide (HfO). The gate insulating layer 220 may have a multi-layer structure.

The gate electrode 230 may be disposed on the gate insulating layer 220. The gate electrode 230 may include a conductive material. For example, the gate electrode 230 may include a metal, such as aluminum (Al), titanium (Ti), copper (Cu), chromium (Cr), molybdenum (Mo) and tungsten (W). The gate electrode 230 may be insulated from the semiconductor pattern 210 by the gate insulating layer 220. The gate electrode 230 may overlap the channel region of the semiconductor pattern 210. For example, the channel region of the semiconductor pattern 210 may have an electric conductivity corresponding to a voltage applied to the gate electrode 230.

The interlayer insulating layer 240 may be disposed on the gate electrode 230. The interlayer insulating layer 240 may extend beyond the gate electrode 230. For example, a side surface of the gate electrode 230 may be covered by the interlayer insulating layer 240. The interlayer insulating layer 240 may be in direct contact with the gate insulating layer 220 at the outside of the gate electrode 230. The interlayer insulating layer 240 may include an insulating material. For example, the interlayer insulating layer 240 may include silicon oxide (SiO).

The source electrode 250 may be disposed on the interlayer insulating layer 240. The source electrode 250 may include a conductive material. For example, the source electrode 250 may include a metal, such as aluminum (Al), titanium (Ti), copper (Cu), chromium (Cr), molybdenum (Mo) and tungsten (W). The source electrode 250 may be insulated from the gate electrode 230 by the interlayer insulating layer 240. For example, the source electrode 250 may include a material different from the gate electrode 230. The source electrode 250 may be electrically connected to the source region of the semiconductor pattern 210. For example, the gate insulating layer 220 and the interlayer insulating layer 240 may include a source contact hole partially exposing the source region of the semiconductor pattern 210. The source electrode 250 may include a portion overlapping with the source region of the semiconductor pattern 210. For example, the source electrode 250 may be in direct contact with the source region of the semiconductor pattern 210 in the source contact hole.

The drain electrode 260 may be disposed on the interlayer insulating layer 240. The drain electrode 260 may include a conductive material. For example, the drain electrode 260 may include a metal, such as aluminum (Al), titanium (Ti), copper (Cu), chromium (Cr), molybdenum (Mo) and tungsten (W). The drain electrode 260 may be insulated from the gate electrode 230 by the interlayer insulating layer 240. For example, the drain electrode 260 may include a material different from the gate electrode 230. The drain electrode 260 may include the same material as the source electrode 250. The drain electrode 260 may be electrically connected to the drain region of the semiconductor pattern 210. The drain electrode 260 may be spaced away from the source electrode 250. For example, the gate insulating layer 220 and the interlayer insulating layer 240 may include a drain contact hole partially exposing the drain region of the semiconductor pattern 210. The drain electrode 260 may include a portion overlapping with the drain region of the semiconductor pattern 210. For example, the drain electrode 260 may be in direct contact with the drain region of the semiconductor pattern 210 in the drain contact hole.

A first buffer layer 110 may be disposed between the device substrate 100 and the driving circuit. The first buffer layer 110 may prevent pollution due to the device substrate 100 in the formation process of the thin film transistor 200. For example, the first buffer layer 110 may completely cover an upper surface of the device substrate 100 toward the light-emitting device 300. The first buffer layer 110 may include an insulating material. For example, the first buffer layer 110 may include silicon oxide (SiO) and/or silicon nitride (SiN). The first buffer layer 110 may have a multi-layer structure.

A light-blocking pattern 115 may be disposed between the device substrate 100 and the thin film transistor 200. The light-blocking pattern 115 may prevent the change in characteristic of the thin film transistor 200 due to external light. For example, the light-blocking pattern 115 may include a portion overlapping with the semiconductor pattern 210. The light-blocking pattern 115 may include a material capable of blocking the light or absorbing the light. For example, the light-blocking pattern 115 may include a metal, such as aluminum (Al), silver (Ag) and copper (Cu). The light-blocking pattern 115 may be insulated from the semiconductor pattern 210. For example, the light-blocking pattern 115 may be disposed between the device substrate 100 and the first buffer layer 110. The light-blocking pattern 115 may be in direct contact with the device substrate 100.

A lower passivation layer 120 may be disposed on the driving circuit. The lower passivation layer 120 may prevent the damage of the driving circuit due to external impact and moisture. For example, an upper surface of the thin film transistor 200 opposite to the device substrate 100 may be covered by the lower passivation layer 120. The lower passivation layer 120 may include an insulating material. For example, the lower passivation layer 120 may include an inorganic insulating material, such as silicon oxide (SiO) and/or silicon nitride (SiN).

A lower planarization layer 130 may be disposed on the lower passivation layer 120. The lower planarization layer 130 may remove a thickness difference due to the driving circuit. For example, an upper surface of the lower planarization layer 130 toward the light-emitting device 300 may be a flat surface. The lower planarization layer 130 may include an insulating material. The lower planarization layer 130 may include a material different from the lower passivation layer 120. For example, the lower planarization layer 130 may include an organic insulating material.

The light-emitting device 300 may be disposed on the lower planarization layer 130. The light-emitting device 300 may emit light displaying a specific color. For example, the light-emitting device 300 may include a first electrode 310, a light-emitting layer 320 and a second electrode 330, which are sequentially stacked.

The first electrode 310 may include a conductive material. The first electrode 310 may have a high reflectance. For example, the first electrode 310 may include a metal, such as aluminum (Al) and silver (Ag). The first electrode 310 may have a multi-layer structure. For example, the first electrode 310 may have a structure in which a reflective electrode composed of a metal is disposed between transparent electrodes composed of a transparent conductive material, such as ITO and IZO.

The first electrode 310 may be electrically connected to the thin film transistor 200. For example, the lower passivation layer 120 and the lower planarization layer 130 may include an electrode contact hole partially exposing the drain electrode 260 of the thin film transistor 200. The first electrode 310 may include a portion overlapping with the drain electrode 260 of the thin film transistor 200. For example, the first electrode 310 may be in direct contact with the drain electrode 260 of the thin film transistor 200 through the electrode contact hole.

The light-emitting layer 320 may generate light having a luminance corresponding to a voltage difference between the first electrode 310 and the second electrode 330. For example, the light-emitting layer 320 may include an emission material layer (EML) including an emission material. The emission material may include an organic material, an inorganic material or a hybrid material. For example, the transparent touch display apparatus according to the embodiment of the present disclosure may be an organic light-emitting display apparatus including the emission material layer formed of an organic material. The light-emitting layer 320 may have a multi-layer structure. For example, the light-emitting layer 320 may further include at least one of a hole injection layer (HIL), a hole transport layer (HTL), an electron transport layer (ETL) and an electron injection layer (EIL). Thus, in the transparent touch display apparatus according to the embodiment of the present disclosure, the emission efficiency of the light-emitting device 300 may be improved.

The second electrode 330 may include a conductive material. The second electrode 330 may include a material different from the first electrode 310. The second electrode 330 may have a transmittance higher than the first electrode 310. For example, the second electrode 330 may be a transparent electrode composed of the transparent conductive material, such as ITO and IZO. Thus, in the transparent touch display apparatus according to the embodiment of the present disclosure, the light generated from the light-emitting layer 320 may be emitted through the second electrode 330.

A bank insulating layer 140 may be disposed on the lower planarization layer 130. The bank insulating layer 140 may include an insulating material. For example, the bank insulating layer 140 may include an organic insulating material.

The bank insulating layer 140 may include a material different from the lower planarization layer 130. The bank insulating layer 140 may define emission areas EA on the device substrate 100. For example, the bank insulating layer 140 may cover an edge of the first electrode 310. The light-emitting layer 320 and the second electrode 330 of the light-emitting device 300 may be stacked on a portion of the first electrode 310 exposed by the bank insulating layer 140. Thus, in the transparent touch display apparatus according to the embodiment of the present disclosure, the light-emitting device 300 may be controlled, independently.

The second electrode 330 of the light-emitting device 300 may extend on the bank insulating layer 140. For example, the second electrode 330 of the light-emitting device 300 may be electrically connected to the second electrode 330 of adjacent light-emitting device 300. For example, the second electrode 330 of the light-emitting device 300 may be formed simultaneously with the second electrode 330 of adjacent light-emitting device 300. The bank insulating layer 140 may be covered by the second electrode 330.

An encapsulating element 400 may be disposed on the light-emitting device 300. The encapsulating element 400 may prevent damage of the light-emitting device 300 due to external impact and moisture. The encapsulating element 400 may have a multi-layer structure. For example, the encapsulating element 400 may include a first encapsulating layer 410, a second encapsulating layer 420 and a third encapsulating layer 430, which are sequentially stacked. The first encapsulating layer 410, the second encapsulating layer 420 and the third encapsulating layer 430 may include an insulating material. The second encapsulating layer 420 may include a material different from the first encapsulating layer 410 and the third encapsulating layer 430. For example, the first encapsulating layer 410 and the third encapsulating layer 430 may include an inorganic insulating material, and the second encapsulating layer 420 may include an organic insulating material. Thus, in the transparent touch display apparatus according to the embodiment of the present disclosure, damage of the light-emitting device 300 due to the external impact and moisture may be effectively prevented.

The device substrate 100 may include the emission area EA and a transmission area TA. The transmission area TA may be disposed outside the emission area EA. The external light may pass through the transmission area TA. For example, when the image by the light-emitting device 300 is not realized, the transparent touch display apparatus according to the embodiment of the present disclosure may be recognized as transparent glass. The light-emitting device 300 and the driving circuit may be spaced away from the transmission area TA of the device substrate 100. For example, the light-emitting device 300 may be disposed on the emission area EA of the device substrate 100. The thin film transistor 200 of the driving circuit may be disposed between the device substrate 100 and the light-emitting device 300. Thus, in the transparent touch display apparatus, decrease of transmittance due to the light-emitting device 300 and the driving circuit may be prevented.

At least one encapsulating dam 106 may be disposed on the device substrate 100. The encapsulating dam 106 may block the flow of the second encapsulating layer 420 having relatively high fluidity. For example, the second encapsulating layer 420 may be disposed on a portion of the device substrate 100 which is defined by the encapsulating dam 106. The first encapsulating layer 410 and the third encapsulating layer 430 may extend along a surface of the encapsulating dam 106. For example, the third encapsulating layer 430 may be in direct contact with the first encapsulating layer 410 at the outside of the encapsulating dam 106. The emission area EA and the transmission area TA of the device substrate 100 may overlap the encapsulating element 400. For example, the emission area EA and the transmission area TA of the device substrate 100 may be disposed in the portion of the device substrate 100 which is defined by the encapsulating dam 106. The encapsulating dam 106 may include an insulating material. For example, the encapsulating dam 106 may include an organic insulating material. The encapsulating dam 106 may be disposed on the lower planarization layer 130. For example, the encapsulating dam 106 may include the same material as the bank insulating layer 140. In another example, the encapsulating dam 106 may be disposed on the lower passivation layer 120 and may include the same material as the lower planarization layer 130. However, the present disclosure is not limited thereto, and the encapsulating dam 106 may have a multi-layer structure and thus include both a same material as the lower planarization layer 130 and another same material as the bank insulating layer 140.

Touch electrodes TE and routing lines 700 may be disposed on the encapsulating element 400. Each of the touch electrodes TE may detect the touch of the user and/or the tool. For example, the touch electrodes TE may be disposed side by side on the encapsulating element 400. A touch buffer layer 500 may be disposed between the encapsulating element 400 and the touch electrodes TE, and between the encapsulating element 400 and the routing lines 700. The touch buffer layer 500 may prevent the damage of the light-emitting device 300 due to the formation process of the touch electrodes TE and the routing lines 700. The touch buffer layer 500 may include an insulating material. For example, the touch buffer layer 500 may include an inorganic insulating material, such as silicon oxide (SiO) and/or silicon nitride (SiN).

Each of the touch electrodes TE may include a portion which is disposed on the transmission area TA of the device substrate 100. The touch electrodes TE may include a material having high transmittance. For example, each of the touch electrodes TE may be a transparent electrode composed of a transparent conductive material, such as ITO and IZO, but the present disclosure is not limited thereto. Each of the touch electrodes TE may include a touch pattern 600 of mesh shape which extends in a first direction and a second direction different to the first direction. However, the present disclosure is not limited thereto, and the shape of the touch electrodes TE may have various shapes other than the mesh shape. Thus, in the transparent touch display apparatus according to the embodiment of the present disclosure, the decrease of the transmittance due to the touch electrodes TE may be minimized. Further, in the transparent touch display apparatus according to the embodiment of the present disclosure, a parasitic capacitance between the second electrode 330 and the touch electrode TE may be minimized. Therefore, in the transparent touch display apparatus according to the embodiment of the present disclosure, an area for detecting the touch may be sufficiently secured, and the reliability of the touch detection may be improved.

The routing lines 700 may electrically connect each touch electrode TE to a touch detecting part TD of the driving parts DD, SD, TD and TC. For example, each of the routing lines 700 may be electrically connected to one of the touch electrodes TE. The routing lines 700 may include a conductive material. The routing lines 700 may have an electrical conductivity higher than the touch electrodes TE. For example, the routing lines 700 may include a metal, such as aluminum (Al), titanium (Ti), copper (Cu), chromium (Cr), molybdenum (Mo) and tungsten (W). The resistance of each routing line 700 may be lower than the resistance of each touch electrode TE. Thus, in the transparent touch display apparatus according to the embodiment of the present disclosure, the response speed according to the touch detection may be improved.

The routing lines 700 may be disposed outside the emission area EA and the transmission area TA. For example, each of the touch electrodes TE may be electrically connected to the corresponding routing line 700 at the outside of the emission area EA and the transmission area TA. The routing lines 700 may extend side by side in a direction. Thus, in the transparent touch display apparatus according to the embodiment of the present disclosure, reduction of an emission area and decrease of the transmittance due to the routing lines 700 may be prevented.

The routing lines 700 may be disposed on a layer different from the touch electrodes TE. For example, a touch insulating layer 510 covering the touch pattern 600 of each touch electrode TE may be disposed on the touch buffer layer 500, and the routing lines 700 may be disposed on the touch insulating layer 510. The touch insulating layer 510 may include an insulating material. For example, the touch insulating layer 510 may include an inorganic insulating material, such as silicon oxide (SiO) and/or silicon nitride (SiN). The touch insulating layer 510 may include touch contact holes partially exposing each of the touch electrodes TE. Each of the touch electrodes TE may be connected to the corresponding routing line 700 through one of the touch contact holes. Each of the touch electrodes TE may be connected to the corresponding routing line 700 at the outside of the emission area EA and the transparent region TA. For example, the touch pattern 600 of each touch electrode TE may have a shape extending to the transmission area TA from the corresponding routing line 700.

A black matrix 810 and a color filter 820 may be disposed on the routing lines 700. The black matrix 810 may be disposed on the routing lines 700. Thus, in the transparent touch display apparatus according to the embodiment of the present disclosure, the moire phenomenon due to the routing lines 700 may be prevented by the black matrix 810. The black matrix 810 may be disposed between the emission area EA and the transmission area TA. Therefore, in the transparent touch display apparatus according to the embodiment of the present disclosure, reduction of the emission area and decrease of the transmittance due to the black matrix 810 may be prevented.

The color filter 820 may be disposed side by side with the black matrix 810. For example, an end of the color filter 820 may overlap the black matrix 810. The color filter 820 may overlap the emission area EA. The light generated by the light-emitting device 300 may be emitted to the outside through the color filter 820. The color filter 820 may realize a specific color using the light emitted from the light-emitting device 300. Thus, in the transparent touch display apparatus according to the embodiment of the present disclosure, the image composed of various colors may be realized.

A touch passivation layer 520 may be disposed between the routing lines 700 and the black matrix 810. The touch passivation layer 520 may prevent the damage of the routing lines 700 due to the formation process of the black matrix 810 and the color filter 820. For example, the touch passivation layer 520 may extend on the emission area EA and the transmission area TA. The touch passivation layer 520 may include an insulating material. For example, the touch passivation layer 520 may include an inorganic insulating material, such as silicon oxide (SiO) and/or silicon nitride (SiN).

The black matrix 810 and the color filter 820 may be covered by a cover planarization layer 550. The cover planarization layer 550 may remove a thickness difference due to the black matrix 810 and the color filter 820. The cover planarization layer 550 may include an insulating material. The cover planarization layer 550 may include a transparent material. For example, the cover planarization layer 550 may include an organic insulating material.

A cover substrate 900 may be disposed on the cover planarization layer 550. The cover substrate 900 may be attached on the cover planarization layer 550 by a cover adhesive layer 901. The cover substrate 900 may relieve the external impact. The cover substrate 900 may include an insulating material. The cover substrate 900 may include a transparent material. For example, the cover substrate 900 may include glass or plastic. A polarizer 910 may be disposed on the cover substrate 900. Thus, in the transparent touch display apparatus according to the embodiment of the present disclosure, the quality deterioration of the image due to the reflection of the external light may be prevented.

The display panel DP may be electrically connected to the driving parts DD, SD, TD and TC through pads 104 and 704. For example, at least one display pad 104 electrically connected to the driving circuit and touch pads 704 respectively connected to the touch electrodes TE through the routing lines 700 may be disposed on a portion of the device substrate 100. The display pad 104 and the touch pads 704 may be disposed outside the encapsulating dam 106. For example, the display pad 104 and the touch pads 704 may be spaced away from the encapsulating element 400.

The routing lines 700 may extend along a surface of the encapsulating element 400 opposite to the device substrate 100, so that each of the routing lines 700 may be connected to the corresponding touch pad 704. For example, the touch buffer layer 500, the touch insulating layer 510, the routing lines 700 and the touch passivation layer 520 may extend to the outside of the encapsulating dam 106, and the touch passivation layer 520 may expose a portion of each routing line 700. That is, in the transparent touch display apparatus according to the embodiment of the present disclosure, the touch pads 704 may include the same material as the routing lines 700. Thus, in the transparent touch display apparatus according to the embodiment of the present disclosure, the process efficiency may be improved.

Accordingly, the transparent touch display apparatus according to the embodiment of the present disclosure may include the light-emitting device 300 disposed on the emission area EA of the device substrate 100, the touch electrodes TE disposed side by side on the transparent region TA of the device substrate 100, and the routing lines 700 disposed outside the emission area EA and the transmission area TA of the device substrate 100, wherein each of the routing lines 700 may be connected to one of the touch electrodes TE at the outside of the emission area EA and the transmission area TA, and wherein the touch electrodes TE may have transmittance higher than the routing lines 700. Thus, in the transparent touch display apparatus according to the embodiment of the present disclosure, decrease of the transmittance may be minimized, and a space between the routing lines 700 may be sufficiently secured. Further, in the transparent touch display apparatus according to the embodiment of the present disclosure, the touch electrodes TE having relative high transmittance may be located on the transmission area TA of the device substrate 100, so that a region for detecting the touch of the user and/or the tool may be sufficiently secured. Therefore, in the transparent touch display apparatus according to the embodiment of the present disclosure, reliability of touch detection may be improved.

Figure 5:
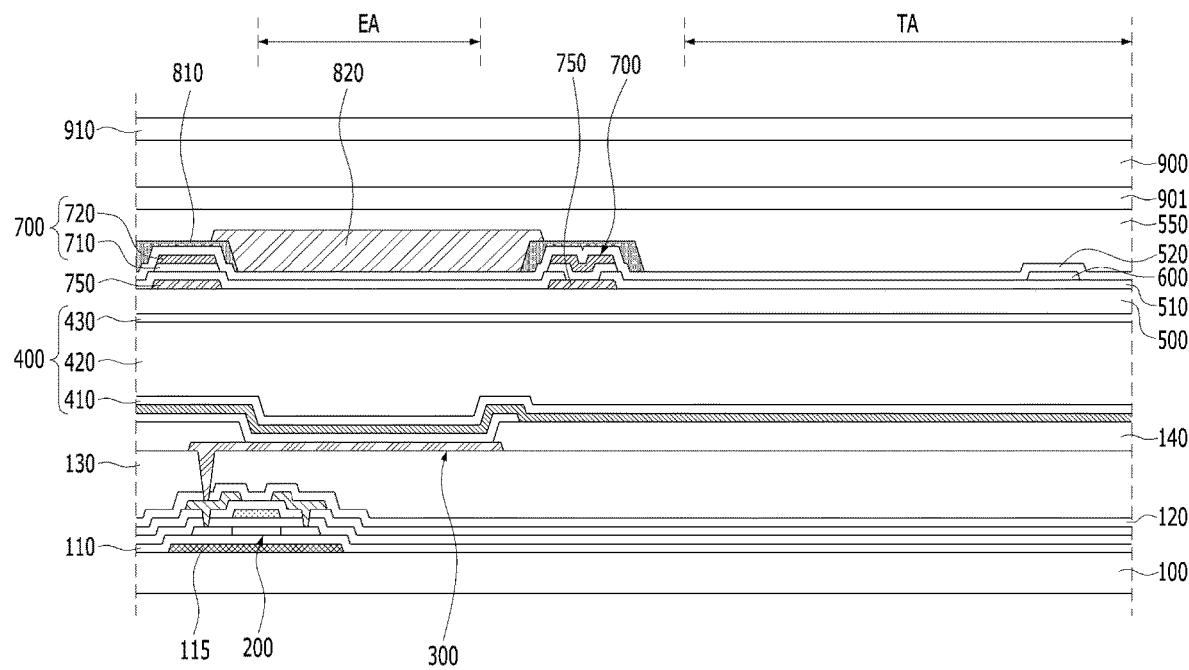
FIGS. 5 to 8 are cross-sectional views showing the transparent touch display apparatus according to another embodiment of the present disclosure.

The transparent touch display apparatus according to the embodiment of the present disclosure allows the touch of the user and/or the tool to be detected by the touch electrodes TE on the transmission area TA of the device substrate 100. However, in the transparent touch display apparatus according to another embodiment of the present disclosure, the touch of the user and/or the tool between the emission area EA and the transmission area TA of the device substrate 100 may be detected. For example, in the transparent touch display apparatus according to another embodiment of the present disclosure, a touch line 750 overlapping with one of the routing lines 700 may be disposed, as shown in FIG. 5. The touch line 750 may extend between the emission area EA and the transmission area TA. For example, the touch line 750 may extend in parallel with the routing lines 700. The touch line 750 may include a conductive material. The touch line 750 may include a material different from the touch pattern 600 of each touch electrode. The touch line 750 may have a resistance lower than the touch pattern 600 of each touch electrode. For example, the touch line 750 may include a metal, such as aluminum (Al), titanium (Ti), copper (Cu), chromium (Cr), molybdenum (Mo) and tungsten (W). The touch line 750 may be connected to one of the routing lines 700. Thus, in the transparent touch display apparatus according to another embodiment of the present disclosure, the accuracy in detecting the touch of the user and/or the tool may be further improved.

In the transparent touch display apparatus according to the embodiment of the present disclosure, the routing lines 700 are disposed on the touch insulating layer 510 covering the touch electrodes TE. However, in the transparent touch display apparatus according to another embodiment of the present disclosure, the touch pattern 600 of each touch electrode may be disposed on the same layer as the routing lines 700, as shown in FIG. 5. For example, the touch pattern 600 of each touch electrode and the routing lines 700 may be disposed on the touch insulating layer 510. Each of the routing lines 700 may have a stacked structure of a first conductive layer 710 and a second conductive layer 720. The second conductive layer 720 may have a resistance lower than the first conductive layer 710. The first conductive layer 710 may have a transmittance higher than the second conductive layer 720. For example, the first conductive layer 710 may include the same material as the touch pattern 600 of each touch electrode. Thus, in the transparent touch display apparatus according to another embodiment of the present disclosure, the resistance of the routing lines 700 may be lowered. The touch pattern 600 of each touch electrode may be connected to the first conductive layer 710 of the corresponding routing line 700. Therefore, in the transparent touch display apparatus according to another embodiment of the present disclosure, a process of connecting the touch pattern 600 of each touch electrode to one of the routing lines 700 may be simplified.

Figure 6:
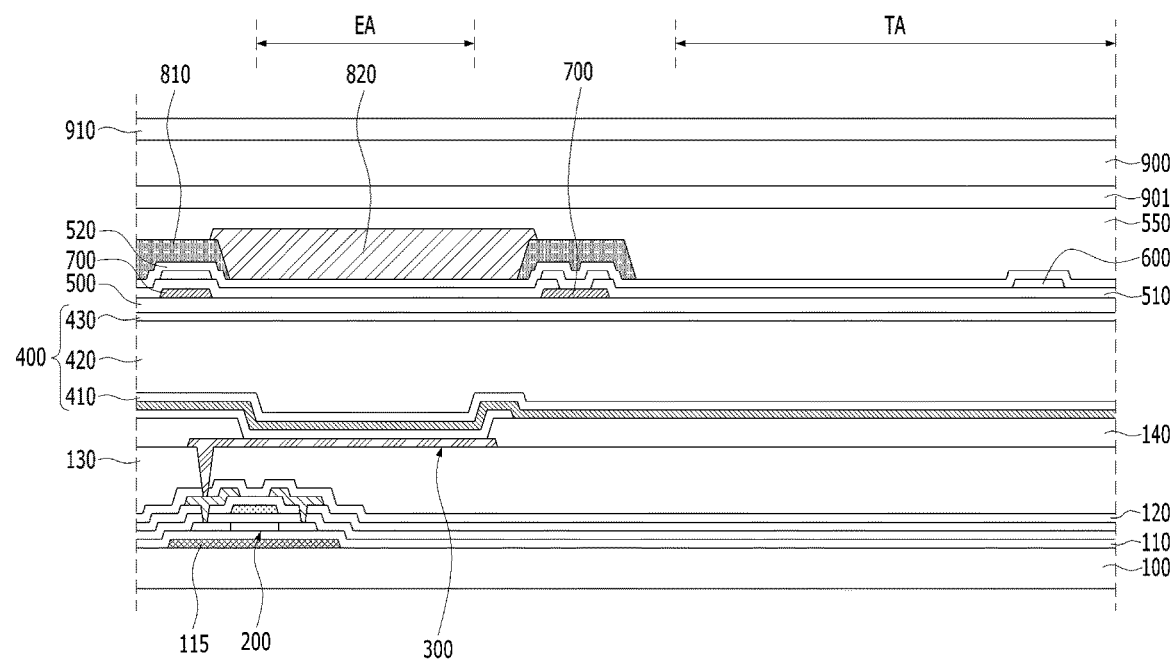

In the transparent touch display apparatus according to the embodiment of the present disclosure, the touch electrodes TE are disposed between the touch buffer layer 500 and the touch insulating layer 510. However, in the transparent touch display apparatus according to another embodiment of the present disclosure, the routing lines 700 may be disposed between the touch buffer layer 500 and the touch insulating layer 510, and the touch pattern 600 of each touch electrode may be disposed on the touch insulating layer 510, as shown in FIG. 6. Thus, in the transparent touch display apparatus according to another embodiment of the present disclosure, the degree of freedom for a relative position between the touch pattern 600 of each touch electrode and the routing lines 700 may be improved.

Figure 7:
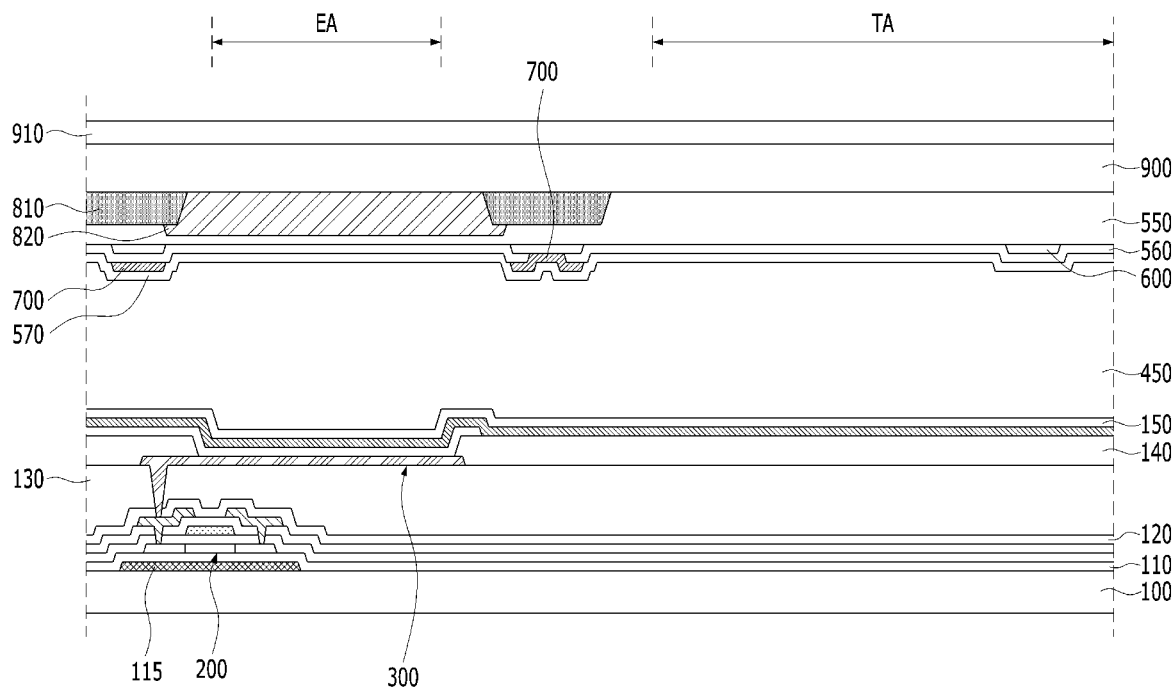
Figure 8:
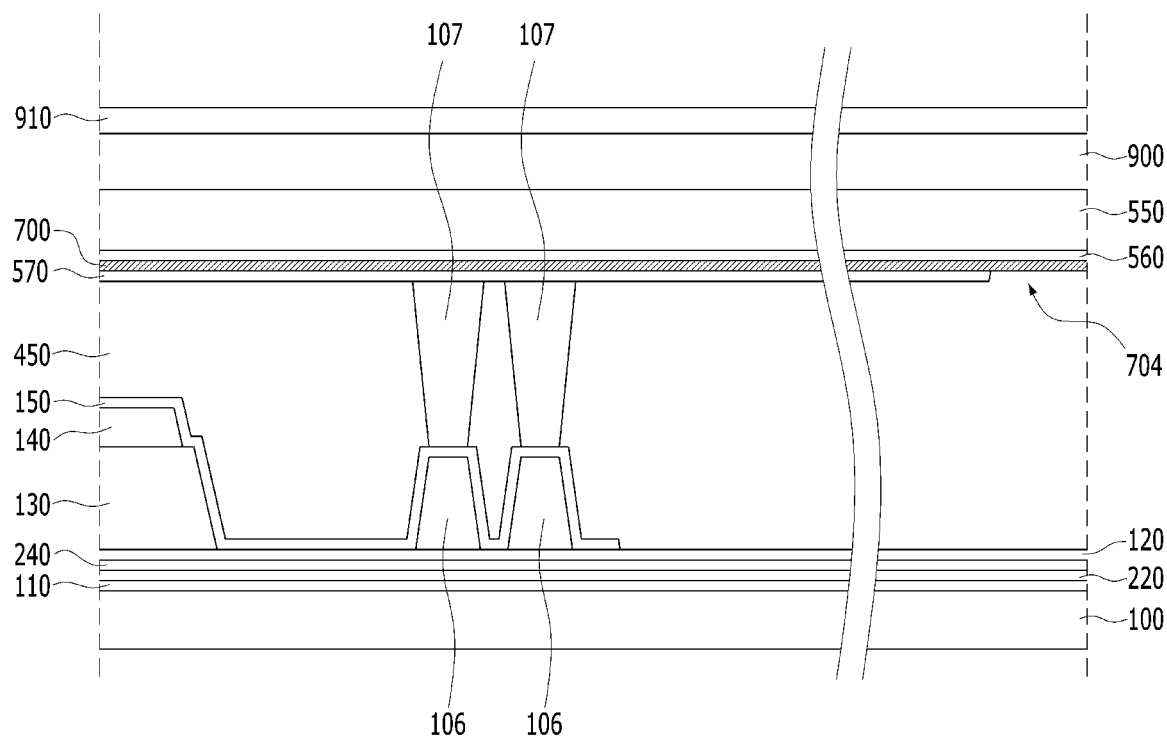

In the transparent touch display apparatus according to the embodiment of the present disclosure, the routing lines 700, the touch electrodes TE, the black matrix 810 and the color filter 820 are disposed on the encapsulating element 400. However, in the transparent touch display apparatus according to another embodiment of the present disclosure, the black matrix 810, the color filter 820, the routing lines 700 and the touch pattern 600 of each touch electrode may be disposed on a lower surface of the cover substrate 900 toward the device substrate 100, as shown in FIGS. 7 and 8. The black matrix 810 and the color filter 820 may be in direct contact with the cover substrate 900. The routing lines 700 and the touch pattern 600 of each touch electrode may be disposed on the cover planarization layer 550 covering the black matrix 810 and the color filter 820. For example, the touch pattern 600 of each touch electrode may be in contact with the cover planarization layer 550. The light-emitting device 300 on the emission area EA of the device substrate 100 may be covered by an upper passivation layer 150. The routing lines 700 are insulated from the touch pattern 600 of each touch electrode by a touch insulating layer 560, and may be covered by a cover passivation layer 570. An adhesive layer 450 may be disposed between the upper passivation layer 150 and the cover passivation layer 570. For example, an adhesive dam 107 may be disposed between the encapsulating dam 106 and the cover planarization layer 550. The adhesive layer 450 may be disposed in a region defined by the adhesive dam 107. The cover passivation layer 570, the routing lines 700 and the touch insulating layer 560 may extend beyond the adhesive dam 107. The cover passivation layer 570 may expose a portion of each routing line 700 to form the touch pads 704. For example, the touch pads 704 may be disposed outside the adhesive dam 107. That is, in the transparent touch display apparatus according to another embodiment of the present disclosure, the touch pads 704 may be disposed on the lower surface of the cover substrate 900. Thus, in the transparent touch display apparatus according to another embodiment of the present disclosure, the damage of the light-emitting device 300 due to the formation process of the black matrix 810, the color filter 820, the routing lines 700 and the touch pattern 600 of each touch electrode may be prevented. Therefore, in the transparent touch display apparatus according to another embodiment of the present disclosure, the process efficiency may be improved.

As a result, the transparent touch display apparatus according to the embodiments of the present disclosure may include the light-emitting device on the emission area of the device substrate, the touch electrodes on the transmission area of the device substrate, and the routing lines disposed outside the emission area and the transmission area, wherein the routing lines may be respectively connected to the touch electrodes, and wherein the touch electrodes may have transmittance higher than the routing lines. Thus, in the transparent touch display apparatus according to the embodiments of the present disclosure, decrease of the transmittance may be minimized, and the routing lines may be sufficiently spaced. Thus, distortion of the touch signal due to the density of the routing lines can be reduced or prevented. Thereby, in the transparent touch display apparatus according to the embodiments of the present disclosure, the reliability of the touch detection may be improved.

What is claimed is:

1. A touch display apparatus comprising:
a device substrate including an emission area in which light-emitting devices are disposed, and a transmission area spaced apart from a first electrode of each light-emitting device from the light-emitting devices such that the transmission area is non-overlapping with the first electrode of each light-emitting device;
an encapsulating element on the light-emitting devices, the encapsulating element extending on the transmission area;
a routing line on the encapsulating element, the routing line spaced apart from the emission area and the transmission area; and
a touch electrode having a transmittance that is greater than a transmittance of the routing line, the touch electrode electrically connected to the routing line between the emission area and the transmission area,
wherein the touch electrode has a mesh shape overlapping with the transmission area, which extends in a first direction and a second direction different from the first direction.

2. The touch display apparatus according to claim 1, wherein the second direction is perpendicular to the first direction.

3. The touch display apparatus according to claim 1, wherein each of the light-emitting devices includes a second electrode on the first electrode, the second electrode having a transmittance that is greater than the transmittance of the first electrode and the transmittance of the routing line, and the second electrode extending onto the transmission area of the device substrate.

4. The touch display apparatus according to claim 3, wherein the mesh shape of the touch electrode overlaps the second electrode on the transmission area.

5. The touch display apparatus according to claim 3, wherein each of the light-emitting devices includes a light-emitting layer between the first electrode and the second electrode, the light-emitting layer extending onto a bank insulating layer that is adjacent the emission area, and the transmission area spaced apart from the light-emitting layer.

6. The touch display apparatus according to claim 5, wherein the bank insulating layer extends onto the transmission area.

7. The touch display apparatus according to claim 1, further comprising:
a black matrix on the routing line; and
color filters in a region defined by the black matrix, the color filters overlapping with the light-emitting devices,
wherein the transmission area is spaced apart from the color filters and the black matrix.

8. The touch display apparatus according to claim 7, wherein the black matrix is on a same layer as the color filters.

9. The touch display apparatus according to claim 1, wherein the routing line has a stacked structure of a first conductive layer and a second conductive layer, and the first conductive layer is on a same layer as the touch electrode.

10. The touch display apparatus according to claim 9, wherein a transmittance of the first conductive layer is greater than a transmittance of the second conductive layer.

11. The touch display apparatus according to claim 9, wherein the first conductive layer includes a same material as the touch electrode.

12. The touch display apparatus according to claim 9, wherein the second conductive layer is between the encapsulating element and the first conductive layer.

13. The touch display apparatus of claim 1, wherein the touch electrode overlaps the routing line in an area between the emission area and the transmission area and the touch electrode is in direct contact with the routing line in the area between the emission area and the transmission area.

14. A touch display apparatus comprising:
- a device substrate including an emission area in which light-emitting devices are disposed, and a transmission area spaced apart from a first electrode of each light-emitting device from the light-emitting devices such that the transmission area is non-overlapping with the first electrode of each light-emitting device;
- an encapsulating element on the emission area and the transmission area of the device substrate, the encapsulating element covering the light-emitting devices;
- a routing line on the encapsulating element, the routing line including a region between the emission area and the transmission area; and
- a touch electrode electrically connected to the routing line, the touch electrode extending on the transmission area,
- wherein a transmittance of the touch electrode is greater than a transmittance of the routing line, and the touch electrode includes apertures overlapping with the transmission area.

15. The touch display apparatus according to claim 14, wherein the routing line has a resistance that is less than a resistance of the touch electrode.

16. The touch display apparatus according to claim 14, wherein a width of each aperture in a first direction is greater than a width of the touch electrode in the first direction.

17. The touch display apparatus according to claim 14, wherein the touch electrode is spaced apart from a non-emission region, the non-emission region between the light-emitting devices.

18. The touch display apparatus according to claim 17, wherein the routing line includes a region overlapping with the non-emission region between the light-emitting devices.

* * * * *